United States Patent [19]

Bennett

[11] Patent Number: 4,628,147
[45] Date of Patent: Dec. 9, 1986

[54] SEMICONDUCTOR HOUSINGS

[75] Inventor: Roger F. C. Bennett, Melksham, United Kingdom

[73] Assignee: Westinghouse Brake and Signal Company Limited, United Kingdom

[21] Appl. No.: 725,590

[22] Filed: Apr. 22, 1985

[30] Foreign Application Priority Data

Apr. 27, 1984 [GB] United Kingdom ............... 8410847

[51] Int. Cl.[4] ............................................. H01L 23/02
[52] U.S. Cl. .............................. 174/52 P; 174/50.61; 357/74
[58] Field of Search ......... 174/50.61, 152 GM, 17.05, 174/17.07, 17.08, 52 P; 357/74

[56] References Cited

U.S. PATENT DOCUMENTS

| | | | |
|---|---|---|---|
| 2,162,489 | 6/1939 | Matthies et al. | 174/152 GM X |
| 2,454,572 | 11/1948 | Roovers | 174/17.08 X |
| 3,452,254 | 6/1969 | Boyer | 174/52 P X |
| 3,473,071 | 10/1969 | Rigden et al. | 174/50.61 X |
| 3,831,067 | 8/1974 | Wislocky et al. | 174/52 P X |
| 4,008,486 | 2/1977 | Byczkowski | 174/52 P X |
| 4,249,034 | 2/1981 | Fichot et al. | 174/17.05 X |
| 4,337,302 | 6/1982 | Takizawa | 174/50.61 X |

FOREIGN PATENT DOCUMENTS

| | | | |
|---|---|---|---|
| 868638 | 10/1941 | France | 174/1526 M |
| 713722 | 8/1954 | United Kingdom . | |
| 860395 | 2/1961 | United Kingdom . | |
| 12277739 | 4/1971 | United Kingdom . | |

Primary Examiner—Arthur T. Grimley
Assistant Examiner—D. A. Tone
Attorney, Agent, or Firm—Welsh & Katz, Ltd.

[57] ABSTRACT

A semiconductor housing particularly useful for very high current devices, e.g. transistors and G.T.O. thyristors, in which a control lead to the base or gate of the device, which also has to carry a relatively high current, passes through an insulating wall of the housing. This control lead is enclosed within a tube which passes through an insulating wall of the housing and which is hermetically sealed to it, the tube is also hermetically sealed to the conductor at either end. The coefficient of expansion of the tube is chosen so as to be substantially the same as the coefficient of expansion of the material of the insulating wall, which may be made of ceramic material or the like. The arrangement avoids corrosion effects as a result of the entrapment of plating salts etc. which are known to adversely affect the assembly and especially the electrical performance of the control lead connection.

6 Claims, 1 Drawing Figure

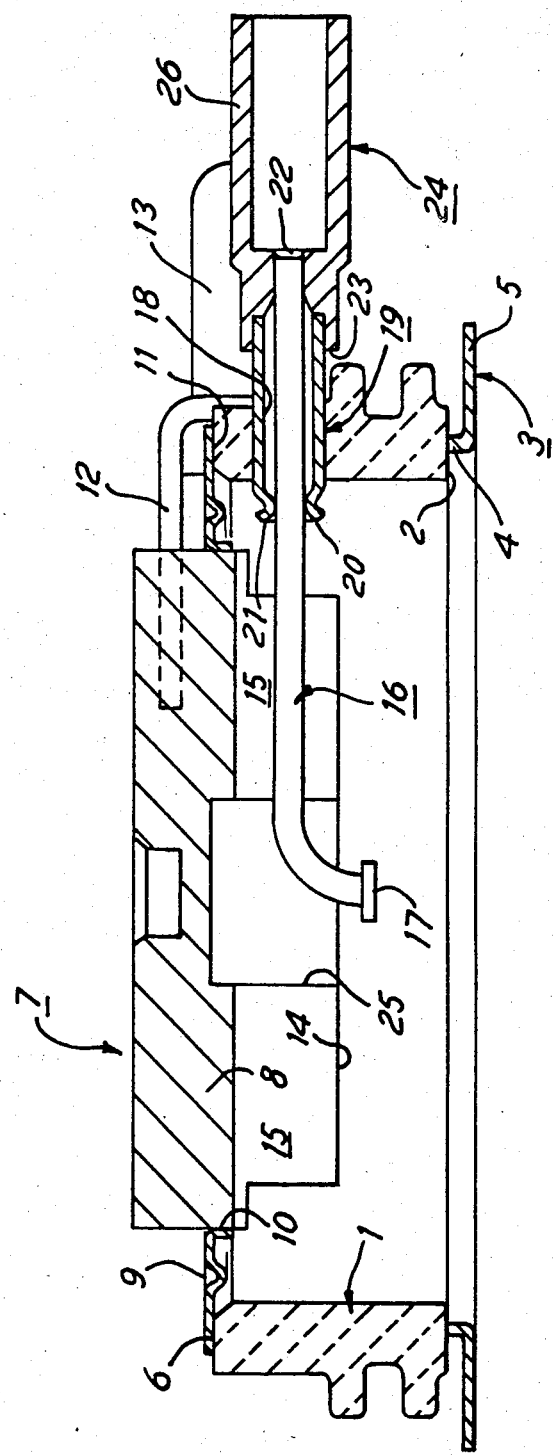

SEMICONDUCTOR HOUSINGS

This invention relates to semiconductor housings and, more particularly to such housings of the so-called "capsule" type.

Semiconductor capsule housings are, of themselves well-known and comprise two housing parts of which at least one has a ring of ceramic or similar electrically—insulating material to one face of which is secured a metallic flange by which the housing part can be secured to the other housing part and to the other face of which is secured an electrical contact. A semiconductor assembly can be sandwiched between the electrical contact of the one housing part and a contact on the other housing part.

When such housings are used for multi-terminal devices such as transistors or G.T.O. thyristors, further electrical contact has to be made to the semiconductor assembly for a control lead to a gate or base contact. In very high current transistors and G.T.O. thyristors the control lead may have to carry currents of comparatively high value (e.g. up to 50A) compared to the gate or base currents of normal thyristors or small transistors (e.g. typically in the range 10 mA to 1A). It is conventional for this contact to be made by an electrical conductor which passes through the ring of ceramic or similar electrically insulating material. This type of construction presents several manufacturing and assembly problems. Firstly, clearly the electrical conductor must be hermetically sealed to the ring where it passes therethrough to ensure an air-tight housing for the semiconductor assembly and thereby prevent its contamination. Secondly, particularly for high-power semiconductor devices, the electrical conductor must provide an electrical path of the lowest possible resistance. Thirdly, because of the temperature variations to which the device is subject in use, the material of that part by which the conductor is hermetically sealed to the ring must have a coefficient of expansion comparable to that of the material of the ring to avoid "fatiguing" of the joint between that part and the ring. Fourthly, the total electrical conductor assembly must be sufficiently mechanically strong as to withstand at least normal usage.

A further problem arises during treatment of the housing part after manufacture. It is conventional for the metallic parts of the housing part to be plated after manufacture of the assembly. It has been proposed to meet the problem of matching the coefficients of expansion discussed above by a construction through which the electrical conductor passes and which is hermetically sealed to the outer end of a tube of a material of a coefficient of expansion comparable to that of the ring. However, with such a construction, the salts used in the subsequent plating process creep between the electrical conductor and the tube. It is then impossible to "flush out" these salts and they remain entrapped in the tube where they both corrode the electrical conductor and/or the tube and, additionally, contaminate the encapsulated semiconductor assembly as it temperature cycles during use.

The present invention provides a new form of semiconductor capsule housing part and a method for its manufacture which minimizes the problems above discussed.

According to the present invention a semiconductor housing is provided for a multi-terminal semiconductor device comprising an enclosure bounded by a continuous wall of ceramic or the like insulating material through which passes a conductor to form a connection between a device inside the enclosure and connector means outside the enclosure, and the conductor in the region of the wall is surrounded by a hollow member of material having a coefficient of expansion comparable to that of the continuous wall and which is hermetically sealed to the wall around the aperture and which is hermetically sealed at both its ends by high temperature brazing.

In a particular embodiment a semiconductor capsule housing part for a multi-terminal device comprises a ring of ceramic or similar electrically insulating material; a metallic flange secured to one end face of the ring by which the part can be secured to another housing part to complete the capsule housing; an electrical contact secured to and extending across the opposite end face of the ring and between which and an electrical contact on said another housing part a semiconductor assembly can be sandwiched; a tube which passes through and is hermetically sealed to the ring, the tube being of a coefficient expansion comparable to that of the material of the ring; a one-piece electrical conductor which passes through the bore of the tube and extends from internally of the housing part to externally thereof and is hermetically sealed to the tube at its end thereof lying inside the housing part; and an electrical connector hermetically sealed to the ends lying externally of the housing part of both the tube and the electrical conductor.

The flange may extend from the housing part initially in an axial direction thereof and afterwards radially thereof.

The electrical contact may comprise a relatively massive central part which constitutes also a heat sink as well as an electrical contact, the central part being hermetically sealed to the internal periphery of a relatively flexible annular diaphragm of which the external peripheral region is hermetically secured to said opposite end face of the ring.

The tube may conveniently be formed of KOVAR (Registered trademark) or a nickel-iron alloy.

The one-piece electrical conductor may be a wire of circular cross-section or may be a stamping from sheet material. In the former case, the end of the conductor lying internally of the housing part may be formed with a head of larger cross-sectional area than the wire.

The bore of the tube at a region adjacent to the end thereof lying internally of the housing part may be of reduced cross-sectional area as compared to the remainder of the tube and may be so formed as to provide between itself and the electrical conductor, prior to being hermetically sealed to the electrical conductor, a "well" surrounding the electrical conductor into which brazing material can be deposited subsequently to form the hermetic sealing of the tube to the electrical conductor. The reduced cross-sectional area of the tube may be constituted by a "waist" formed in said region of the tube. Alternatively, the extreme end of the tube may extend radially inwardly of the remainder of the tube so that the end face of the tube which lies internally of the housing part lies adjacent the electrical conductor and forms therewith the region by which the tube is hermetically sealed to the electrical conductor. In yet another alternative, the tube may be hermetically sealed to the electrical conductor by a washer the internally periphery of which is hermetically sealed to the electrical conductor and one face of which is hermetically sealed to the end of the tube lying internally of the housing part. In yet a further alternative, the bore of the tube may be so dimensioned relative to the cross-sectional area and shape of the electrical conductor that there is provided between them a capillary path of such dimensions as to be hermetically closed only in the region of the tube at its end lying internally of the housing part by brazing material.

The present invention also provides a method of manufacture of a semiconductor capsule housing part as above described, in which the ring, the flange, the electrical contact, the tube, the electrical conductor and the electrical connector are all first assembled and are all subsequently secured together in a single brazing operation. Foils of braze alloy are inserted in the interstices to be sealed and the whole assembly then heated to brazing temperature in a hydrogen or vacuum furnace.

One embodiment of the present invention will now be described in greater detail, by way of example only, with reference to the accompanying drawing which shows a cross-sectional view of the housing part.

Referring to the drawing, the housing part (which is for a semiconductor multi-terminal device capsule housing) comprises a ring 1 of ceramic or similar electrically—insulating material. To the lower (as viewed in the drawing) end face 2 of the ring 1 is brazed a metallic flange 3 which extends from the ring 1 initially, by region 4, in a direction extending axially of the ring 1 and afterwards by region 5, in a direction radially of the ring 1.

Extending across the upper (as viewed in the drawing) end face 6 of the ring 1 is a two-part electrical contact 7. The first and control part 8 of the parts is relatively massive so as also to form a heat sink. This part 8 is secured to the ring 1 by the second part 9 which is a relatively thin and flexible annular diaphragm secured at 10, by its inner periphery to the part 8 and, by its outer peripheral region at 11 to the end face 6 of the ring 1. Extending from the central part 8 is a lead 12 terminating at its free end in a first electrical connector 13.

The central part 8 is generally circular in cross-section but has extending diametrically across its face 14 lying internally of the housing part a groove 15.

Lying with the groove 15 is an electrical conductor 16 constituted by an oxygen free high conductivity, or OFHC, copper wire (or any other metal) of circular cross-section. (OHFC is a registered trademark). At its end lying internally of the housing part, the conductor 16 is formed with a head 17 which is a greater cross-sectional area than the rest of the conductor 16.

The conductor 16 passes through the bore 18 of a tube 19 formed of KOVAR or a nickel-iron alloy, which material is of comparable coefficient of expansion to that of the material of the ring 1. The tube 19 passes through the ring 1 and is brazed to it so as to be hermetically sealed with respect thereto. In the region 20 of the end of the tube 19 which lies internally of the housing part, the tube 19 is "waisted" i.e. has a region of reduced diameter so as to closely fit the electrical conductor 16. At this "waisted" region, the tube 19 forms a "well" 21 into which brazing material can be inserted so that in a brazing operation the braze flows around the "waist" internally of the tube hermetically to seal the tube 19 by its inner end to the electrical conductor 16.

At the outer end of both the electrical conductor 16 and the tube 19, they are hermetically sealed by brazing at 22 and 23 respectively to a copper electrical connector 24. The tube 19 may be brazed directly to the conductor 16 and the connector 24 mounted independently on the conductor 16 or, alternatively, the connector 24 is extended to overlap the tube 19 and to form the hermetic seal by brazing to both the tube and the conductor. As shown in the drawing the connector 24 has an overlapping part which circumscribes one end of tube 19 and has an adjacent portion of reduced internal diameter closely fitting the conductor 16. Alternatively the overlapping part of connector 24 may lie internally of the tube 19 and have a constant internal diameter. The interstices between the connector 24 and the tube 19 and the conductor 16 are, in both instances, hermetically sealed by brazing.

The above described housing part is manufactured by first assembling the various parts thereof as shown in the drawing with brazing material positioned at all the joints between the parts and thereafter, in a single brazing operation hermetically securing all the parts together.

In use of the above described housing part, it would be assembled with a complementary housing part with a semiconductor assembly positioned between the electrical contact 7 and a similar contact on the other housing part and the flange 3 engaged with a complementary flange on the other housing part. In this position the two electrical contacts would engage associated contact areas of the semiconductor assembly and the head 17 of the electrical conductor 16 would engage a third contact area of the semiconductor assembly. In this assembled condition, the outer periphery of the flange 5 would be sealed to the outer periphery of the flange on the other housing part hermetically to enclose the semiconductor assembly.

To ensure electrical insulation of the electrical conductor 16 from the electrical contact 7, the inner end portion of the conductor 16 would be located in an electrical insulator (not shown) which would sit in the blind bore 25 in the electrical contact 7. Further to ensure insulation, the portion of the electrical conductor 16 lying internally of the housing part between the tube 19 and the head 17, may be covered by a heat shrinkable electrically insulating tube also not shown.

In the form of the electrical connector 24 shown in the drawing, the free end 26 is of tubular shape so that an external electrical connection can be made to the device by brazing an external electrical conductor in the tubular free end 26. In an alternative, the tubular free end 26 may be squashed flat and drilled to provide means by which the external electrical conductor can be fixed to the connector 14 by a nut and bolt.

The above described embodiment shows the end region 20 as being "waisted" to provide a close fit of the tube 19 to the electrical conductor 16. In an alternative, the inner end extremity of the tube 19 could have been turned to extend radially inwardly of the tube, the internal end face of the tube 19 then providing the close fit of the end region to the electrical conductor 16. Alternatively, the inner end of the tube 19 may be hermetically sealed to the electrical conductor 16 by a washer brazed by its inner periphery to the electrical conductor 16 and by one face to the inner end face of the tube 19.

I claim:

1. A semiconductor housing for a multi-terminal semiconductor device comprising a hermetically sealed enclosure bounded by a wall of electrically insulating ceramic material, said ceramic material having a first coefficient of expansion, said wall having an aperture and a hollow member passing through said aperture and extending on either side thereof, said hollow member having first and second hermetic seals on opposing end portions, said first and second hermetic seals being spaced from said wall, and a conductive wire passing through said hollow member and establishing a connection from inside said enclosure to connector means outside said enclosure, said hollow member being formed of material having a coefficient of expansion substantially equal to said first coefficient of expansion, said hollow member being hermetically sealed to said wall within said aperture, said first and second hermetic seals being formed by high temperature brazing, said hollow member being circumferentially spaced from said conductive wire between said hermetic seals, thereby forming an electrical connection of high strength, yet sufficiently resilient to withstand thermal cycling stresses and maintain said hermetic seals about said hollow member.

2. A semiconductor housing as claimed in claim 1, wherein the hollow member comprises a hollow substantially cylindrical tube.

3. A semiconductor housing as claimed in claim 2 wherein said connector means is brazed to said conductive wire and to said hollow member so as to form a hermetic seal therebetween.

4. A semiconductor housing as claimed in claim 3 wherein said connector means is brazed to said hollow member so as to circumscribe one end of said member.

5. A semiconductor housing as claimed in claim 3 wherein said connector means has a part brazed to said hollow member, said part lying internally of one end of said member.

6. A semiconductor housing as claimed in claim 2 wherein the tube is formed of a nickel-iron alloy.

* * * * *